(12) United States Patent
Yang et al.

(10) Patent No.: US 10,153,139 B2
(45) Date of Patent: Dec. 11, 2018

(54) MULTIPLE ELECTRODE SUBSTRATE SUPPORT ASSEMBLY AND PHASE CONTROL SYSTEM

(71) Applicant: Applied Materials, Inc., Santa Clara, CA (US)

(72) Inventors: Yang Yang, Las Gatos, CA (US); Kartik Ramaswamy, San Jose, CA (US); Steven Lane, Porterville, CA (US); Lawrence Wong, Fremont, CA (US); Shahid Rauf, Pleasanton, CA (US); Andrew Nguyen, San Jose, CA (US); Kenneth S. Collins, San Jose, CA (US); Roger Alan Lindley, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/742,142

(22) Filed: Jun. 17, 2015

(65) Prior Publication Data

US 2016/0372307 A1 Dec. 22, 2016

(51) Int. Cl.
*H01J 37/32* (2006.01)

(52) U.S. Cl.
CPC .... *H01J 37/32715* (2013.01); *H01J 37/3299* (2013.01); *H01J 37/32165* (2013.01); *H01J 37/32568* (2013.01)

(58) Field of Classification Search
CPC ......... H01L 37/32082; H01L 37/32715; C23C 14/48; C23C 16/458; C23C 16/505
See application file for complete search history.

(56) References Cited

U.S. PATENT DOCUMENTS

| | | | | |
|---|---|---|---|---|
| 6,042,686 | A * | 3/2000 | Dible | H01J 37/32009 118/723 E |
| 7,206,184 | B2 | 4/2007 | Ennis | |
| 8,157,953 | B2 * | 4/2012 | Yamazawa | H01J 37/32082 118/723 E |
| 8,368,308 | B2 | 2/2013 | Banna et al. | |
| 2002/0094591 | A1 | 7/2002 | Sill et al. | |
| 2008/0314408 | A1 | 12/2008 | Jeong et al. | |
| 2009/0206058 | A1 | 8/2009 | Iwata et al. | |
| 2012/0164834 | A1 | 6/2012 | Jennings et al. | |

(Continued)

OTHER PUBLICATIONS

International Search Report and Written Opinion for Application No. PCT/US2016/028311 dated Aug. 3, 2016. 13 total pages.

(Continued)

*Primary Examiner* — Duy Vu N Deo
(74) *Attorney, Agent, or Firm* — Patterson + Sheridan, LLP

(57) ABSTRACT

Implementations described herein provide a substrate support assembly which enables tuning of a plasma within a plasma chamber. In one embodiment, a method for tuning a plasma in a chamber is provided. The method includes providing a first radio frequency power and a direct current power to a first electrode in a substrate support assembly, providing a second radio frequency power to a second electrode in the substrate support assembly at a different location than the first electrode, monitoring parameters of the first and second radio frequency power, and adjusting one or both of the first and second radio frequency power based on the monitored parameters.

19 Claims, 4 Drawing Sheets

(56) References Cited

U.S. PATENT DOCUMENTS

| | | |
|---|---|---|
| 2012/0217221 A1* | 8/2012 | Hoffman ............... C23C 14/345 216/61 |
| 2013/0256271 A1 | 10/2013 | Panagopoulos et al. |
| 2014/0265910 A1 | 9/2014 | Kobayashi et al. |
| 2015/0000843 A1 | 1/2015 | Koshiishi et al. |
| 2015/0357209 A1 | 12/2015 | Marakhtanov et al. |

OTHER PUBLICATIONS

M.R. Sogard et al., 2007 EUVL symposium paper, <http://www.sematech.org/meetings/archives/litho/8059/poster/MA-P04-%20Engelstad.pdf> (accessed May 2, 2017).

* cited by examiner

MULTIPLE ELECTRODE SUBSTRATE SUPPORT ASSEMBLY AND PHASE CONTROL SYSTEM

BACKGROUND

Field

Embodiments disclosed herein generally relate to semiconductor manufacturing and more particularly to a substrate support assembly and method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In the current semiconductor manufacturing industry, transistor structures have become increasingly complicated and challenging with the development of the FinFet technology, for example. On the substrate processing level, there is a need for advancements in process uniformity control to allow fine, localized process tuning as well as global processing tuning across the whole substrate. As the transistor density across a substrate increases according to the square of the radius, there is a demand for the capability to control the process at the substrate edge, where the electromagnetic field and plasma density and chemistry change due to the existence of multiple material interfaces and/or multiple geometric shapes.

Thus, there is a need for an improved substrate support assembly that provides aspects that improve process tuning.

SUMMARY

Implementations disclosed herein provide methods and apparatus which enables tuning of a plasma within a plasma chamber. In one embodiment, a method for tuning a plasma in a chamber is provided. The method includes providing a first radio frequency power and a direct current power to a first electrode adjacent to a substrate support surface of a substrate support assembly, providing a second radio frequency power to a second electrode in the substrate support assembly at a location further from the support surface, monitoring parameters of the first and second radio frequency power, and adjusting one or both of the first and second radio frequency power based on the monitored parameters.

In another embodiment, a method for tuning a plasma in a chamber is provided. The method includes providing a first radio frequency power and a direct current power to a first electrode adjacent to a substrate support surface of a substrate support assembly, providing a second radio frequency power to a second electrode in the substrate support assembly at a location further from the support surface, monitoring parameters of the first and second radio frequency power, and shifting a phase of one or both of the first and second radio frequency power based on the monitored parameters.

In another embodiment, a substrate support assembly is provided. The substrate support assembly includes a body having a chucking electrode embedded therein, the chucking electrode including a first radio frequency electrode disposed adjacent to a substrate support surface of the body. The body also includes a second radio frequency electrode disposed in the substrate support assembly at a location further from the support surface. The substrate support assembly also includes a power application system coupled to the substrate support assembly. The power application system includes a radio frequency power source coupled to one or both of the first and second radio frequency electrodes through a matching network, and a sensor coupled between the matching circuit and the first and second radio frequency electrodes.

BRIEF DESCRIPTION OF THE DRAWINGS

So that the manner in which the above recited features of the present disclosure can be understood in detail, a more particular description of the disclosure, briefly summarized above, may be had by reference to embodiments disclosed herein, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Embodiments disclosed herein provide a substrate support assembly and a power application system which enables tuning of a plasma in a processing chamber. The substrate support assembly may include multiple electrodes which are coupled to a power application system enables phase control of the plasma in the chamber. The phase control may be used to manipulate plasma uniformity and/or plasma distribution within the chamber. The controlled plasma distribution may be utilized to tune plasma density radially across a substrate. For example, the plasma may be tuned to have a profile with a greater density at the edge of the substrate relative a density at the center of the substrate, and vice versa. Although the substrate support assembly and power application system is described below in an etch processing chamber, the substrate support assembly and power application system may be utilized in other types of plasma processing chambers, such as physical vapor deposition chambers, chemical vapor deposition chambers, ion implantation chambers, stripping chambers, among others, as well as other plasma systems where tuning of a plasma profile is desirable.

Figure 1:
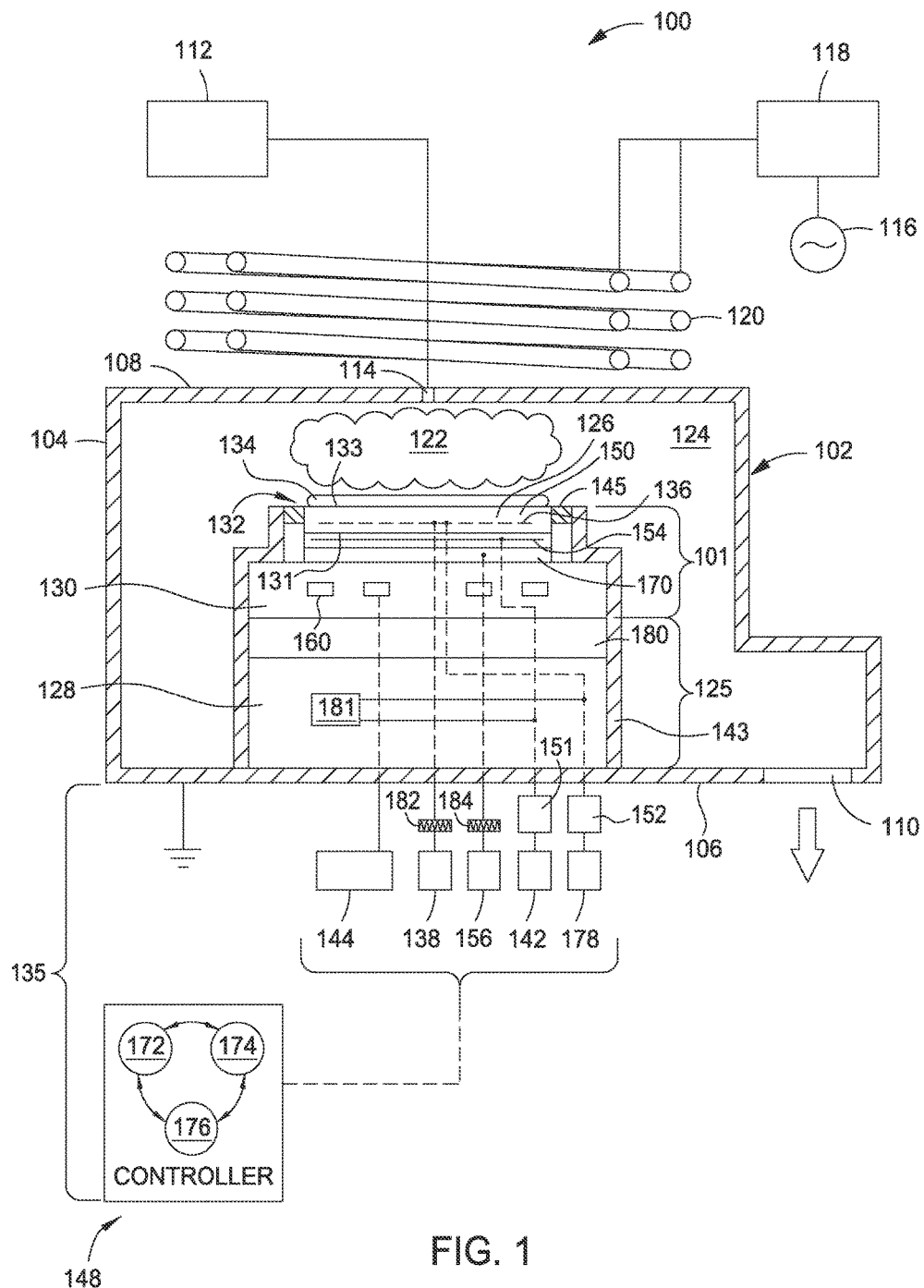
FIG. 1 is a cross-sectional schematic view of an exemplary etch processing chamber having one embodiment of a substrate support assembly.

FIG. 1 is a cross-sectional schematic view of an exemplary etch processing chamber 100 having a substrate support assembly 101. As discussed above, the substrate support assembly 101 may be utilized in other processing chambers, for example plasma treatment chambers, chemical vapor deposition chambers, ion implantation chambers, stripping chambers, among others, as well as other systems where the ability to control a plasma profile at a surface of a substrate, is desirable.

The processing chamber 100 includes a grounded chamber body 102. The chamber body 102 includes walls 104, a bottom 106 and a lid 108 which enclose an internal volume 124. The substrate support assembly 101 is disposed in the internal volume 124 and supports a substrate 134 thereon during processing. The walls 104 of the processing chamber 100 include an opening (not shown) through which the substrate 134 may be robotically transferred into and out of the internal volume 124. A pumping port 110 is formed in one of the walls 104 or the bottom 106 of the chamber body 102, and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the the lid 108 or walls 104 of the chamber body 102. The process gas provided by the gas panel 112 is energized within the internal volume 124 to form a plasma 122. The plasma 122 is utilized to process the substrate 134 disposed on the substrate support assembly 101. The process gases may be energized by RF power inductively coupled to the process gases from a plasma applicator 120 positioned outside the chamber body 102. In the exemplary embodiment depicted in FIG. 1, the plasma applicator 120 is a pair of coaxial coils coupled through a matching circuit 118 to an RF power source 116. In other embodiments (not shown), the plasma applicator may be an electrode, such as a showerhead, that may be used in a capacitively coupled plasma system. The plasma 122 may also be formed utilizing other techniques.

The substrate support assembly 101 generally includes at least a substrate support 132. The substrate support 132 may be a vacuum chuck, an electrostatic chuck, a susceptor, or other substrate support surface. In the embodiment of FIG. 1, the substrate support 132 is an electrostatic chuck and will be described hereinafter as an electrostatic chuck 126.

The substrate support assembly 101 may additionally include a heater assembly 170. The substrate support assembly 101 may also include a cooling base 130. The cooling base 130 may alternately be separate from the substrate support assembly 101. The substrate support assembly 101 may be removably coupled to a support pedestal 125. The support pedestal 125, which may include a pedestal base 128 and a facility plate 180, is mounted to the chamber body 102. The pedestal base 128 may comprise a dielectric material that electrically insulates electrically conductive portions of the substrate support assembly 101 from the chamber body 102. The substrate support assembly 101 may be periodically removed from the support pedestal 125 to allow for refurbishment of one or more components of the substrate support assembly 101.

The substrate support assembly 101 includes a chucking electrode 136, which may be a mesh of a conductive material. The electrostatic chuck 126 has a mounting surface 131 and a substrate support surface 133 opposite the mounting surface 131. The chucking electrode 136 is coupled to a chucking power source 138 that, when energized, electrostatically clamps the substrate 134 to the workpiece support surface 133. The electrostatic chuck 126 generally includes the chucking electrode 136 embedded in a dielectric puck or body 150. The dielectric body 150, as well as other portions of the substrate support assembly 101 and the support pedestal 125, may be disposed within an insulator ring 143. The insulator ring 143 may be a dielectric material, such as quartz or other dielectric material that is process compatible. A focus ring 145 may be disposed about a periphery of the dielectric body 150. The focus ring 145 may be a dielectric or conductive material and may comprise the same material as the substrate 134. The focus ring 145 may be utilized to extend the surface of the substrate 134 with respect to the electromagnetic field of the plasma 122. The focus ring 145 may also minimize the enhancement of electromagnetic field at the edge of the substrate 134, as well as minimize the chemistry effects due to the change in materials at this interface.

The chucking electrode 136 may be configured as a mono polar or bipolar electrode, or have another suitable arrangement. The chucking electrode 136 is coupled through an RF filter 182 to a chucking power source 138 which provides direct current (DC) power to electrostatically secure the substrate 134 to the upper surface of the dielectric body 150. The RF filter 182 prevents RF power utilized to form the plasma 122 within the processing chamber 100 from damaging electrical equipment or presenting an electrical hazard outside the chamber. The dielectric body 150 may be fabricated from a ceramic material, such as AlN or $Al_2O_3$. Alternately, the dielectric body 150 may be fabricated from a polymer, such as polyimide, polyetheretherketone, polyaryletherketone and the like.

The cooling base 130 is used to control the temperature of the substrate support assembly 101. The cooling base 130 may be coupled to a heat transfer fluid source 144. The heat transfer fluid source 144 provides a heat transfer fluid, such as a liquid, gas or combination thereof, which is circulated through one or more conduits 160 disposed in the cooling base 130. The fluid flowing through neighboring conduits 160 may be isolated to enabling local control of the heat transfer between the electrostatic chuck 126 and different regions of the cooling base 130, which assists in controlling the lateral temperature profile of the substrate 134. The substrate support assembly 101 may also include the heater assembly 170 that includes one or more resistive heaters (not shown) encapsulated therein. The heater assembly 170 is coupled to a heater power source 156 that may be used to control power to the resistive heaters. The heater power source 156 may be coupled through an RF filter 184. The RF filter 184 may be used to protect the heater power source 156 from the RF energy. The electrostatic chuck 126 may include one or more temperature sensors (not shown) for providing temperature feedback information to the controller 148 for controlling the power applied by the heater power source 156 and for controlling the operations of the cooling base 130.

The substrate support surface 133 of the electrostatic chuck 126 may include gas passages (not shown) for providing backside heat transfer gas to the interstitial space defined between the substrate 134 and the substrate surface 133 of the electrostatic chuck 126. The electrostatic chuck 126 may also include lift pin holes for accommodating lift pins (both not shown) for elevating the substrate 134 above the substrate support surface 133 of the electrostatic chuck 126 to facilitate robotic transfer into and out of the processing chamber 100.

A power application system 135 is coupled to the substrate support assembly 101. The power application system 135 may include the chucking power source 138, a first radio frequency (RF) power source 142, and a second RF power source 178. Embodiments of the power application system 135 may additionally include a controller 148, and a sensor device 181 that is in communication with the controller 148 and both of the first RF power source 142 and the second RF power source 178.

The controller 148 may be one of any form of general-purpose data processing system that can be used in an industrial setting for controlling the various subprocessors and subcontrollers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124. The controller 148 may also be utilized to control the plasma 122 from the processing gas by application of RF power from the plasma applicator 120, the first RF power source 142 and the second RF power source 178 in order to etch a layer of material on the substrate 134.

As described above, the substrate support assembly 101 includes the chucking electrode 136 that may function in one aspect to chuck the substrate 134 while also functioning as a first RF electrode. The heater assembly 170 may also include a second RF electrode 154, and together with the chucking electrode 136, applies RF power to tune the plasma 122. The first RF power source 142 may be coupled to the second RF electrode 154 while the second RF power source 178 may be coupled to the chucking electrode 136. A first matching network 151 and a second matching network 152 may be provided for the first RF power source 142 and the second RF power source 178, respectively. The second RF electrode 154 may be a solid metal plate of a conductive material as shown. Alternatively, the second RF electrode 154 may be a mesh of conductive material.

The first RF power source 142 and the second RF power source 178 may produce power at the same frequency or a different frequency. In some embodiments, one or both of the first RF power source 142 and the second RF power source 178 may produce power at a frequency of 13.56 megahertz (MHz) or a frequency of 2 MHz. In other embodiments, the first RF power source 142 may produce power at a frequency of 13.56 MHz and the second RF power source 178 may produce power at a frequency of 2 MHz, or vice versa. RF power from one or both of the first RF power source 142 and second RF power source 178 may be varied in order to tune the plasma 122. For example, the sensor device 181 may be used to monitor the RF energy from one or both of the first RF power source 142 and the second RF power source 178. Data from the sensor device 181 may be communicated to the controller 148, and the controller 148 may be utilized to vary power applied by the first RF power source 142 and the second RF power source 178. In one embodiment, phase angle of one or both of the first RF power source 142 and the second RF power source 178 is monitored and adjusted in order to tune the plasma 122.

By changing the phase angle, the plasma uniformity can be tuned. Changing the phase angle will change the voltage/current distribution across the chucking electrode 136 and the second RF electrode 154. Varying the phase angle may also tune the spatial distribution of the plasma across the substrate 134. For example, the phase angle can be utilized to fine tune the process, whether etch rate is center fast, or edge fast, or flat. Adjusting the phase angle may also impact on the sheath dynamics which directly affects processing results. As the chucking electrode 136 is closer to the plasma 122 and the surface of the substrate 134 as compared to the second RF electrode 154, control of the plasma according to this aspect may be extremely effective. In some embodiments, the power application system 135 provides three modes of control including controlling RF power (e.g., frequency and/or wattage) to the chucking electrode 136, controlling RF power (e.g., frequency and/or wattage) to the second RF electrode 154, and control of the phase between the chucking electrode 136 and the second RF electrode 154. This control scheme provides greater process tuning ability and/or the capability for effective edge control. The increased edge control may be due to the size difference of the two concentric electrodes and/or phase control of the RF power applied thereto.

In some embodiments, the surface area of the second RF electrode 154 may be greater than a surface area of the chucking electrode 136. For example, the chucking electrode 136 may include a first dimension or diameter while the second RF electrode 154 has a second dimension or diameter that is greater than the first diameter. In one embodiment, the chucking electrode 136 has a first diameter that is substantially equal to a diameter of the substrate 134. The second RF electrode 154 may include a second diameter that is greater than the first diameter. In one embodiment, the second RF electrode 154 may have a surface area that is about 50% greater than a surface area of the chucking electrode 136. In other embodiments, the second RF electrode 154 may have a surface area that is about 70% to about 80% greater than a surface area of the chucking electrode 136. In one or more embodiments, the difference in surface area may be utilized to control the process rate at different locations of the substrate 134. For example, if power delivered to the second RF electrode 154 is increased, the processing rate of the edge of the substrate 134 increases. If power delivered to the chucking electrode 136 is increased, then the central area of the substrate 134 may be etched at a faster rate with little impact on the edge of the substrate 134. Therefore, a differential control for discrete regions on the entire substrate 134 is achieved.

Figure 2:
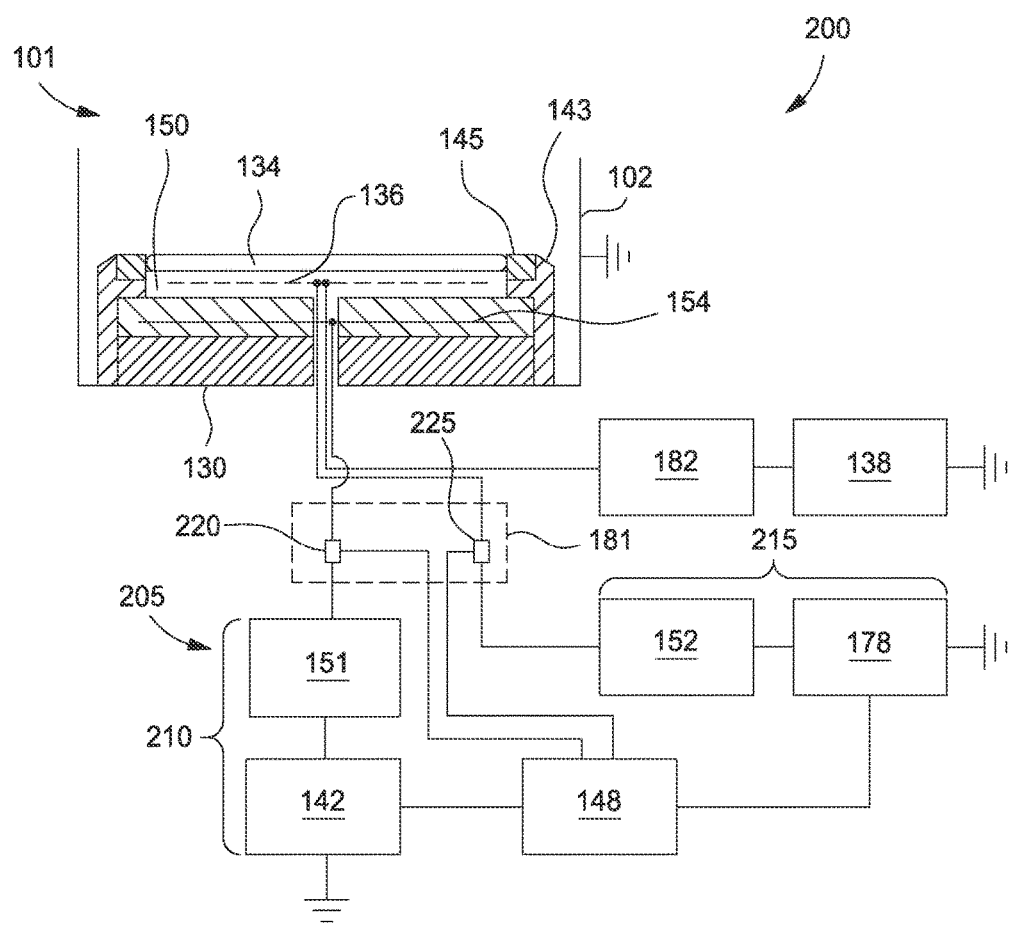
FIG. 2 is a partial schematic cross-sectional view of another embodiment of a processing chamber with another embodiment of a substrate support assembly and a power application system.

FIG. 2 is a partial schematic cross-sectional view of another embodiment of a processing chamber 200 having a substrate support assembly 101 and a power application system 205. Only a lower portion of the processing chamber 200 is shown as the substrate support assembly 101 and the power application system 205 may be utilized in many types of processing chambers. For example, the upper portion of the processing chamber 200 may be configured with hardware for plasma etching, chemical vapor deposition, ion implantation, stripping, physical vapor deposition, plasma annealing, and plasma treatment, among others.

The processing chamber 200 includes the substrate support assembly 101 having the second RF electrode 154 coupled to the first RF power source 142 through matching network 151. The chucking electrode 136 is coupled to the second RF power source 178 through matching network 152. The first RF power source 142, the first matching network 151 and the second RF electrode 154 may comprise a first RF system 210 of the power application system 205. Similarly, the second RF power source 178, the second matching network 152 and the chucking electrode 136 may comprise a second RF system 215 of the power application system 205.

The power application system 205 includes the sensor device 181 that in one embodiment includes a first sensor 220 and a second sensor 225. Each of the first sensor 220 and the second sensor 225 may be voltage and current sensors (e.g., V/I sensors). Thus, the voltage and current of each of the first RF system 210 and the second RF system 215 may be monitored and tuned according to embodiments described herein. Signals from each of the first sensor 220 and the second sensor 225 may be transmitted to the controller 148 and power applied to each of the first RF system 210 and the second RF system 215 may be varied and tuned to control distribution and/or density of plasma within the processing chamber 200.

Figure 3:
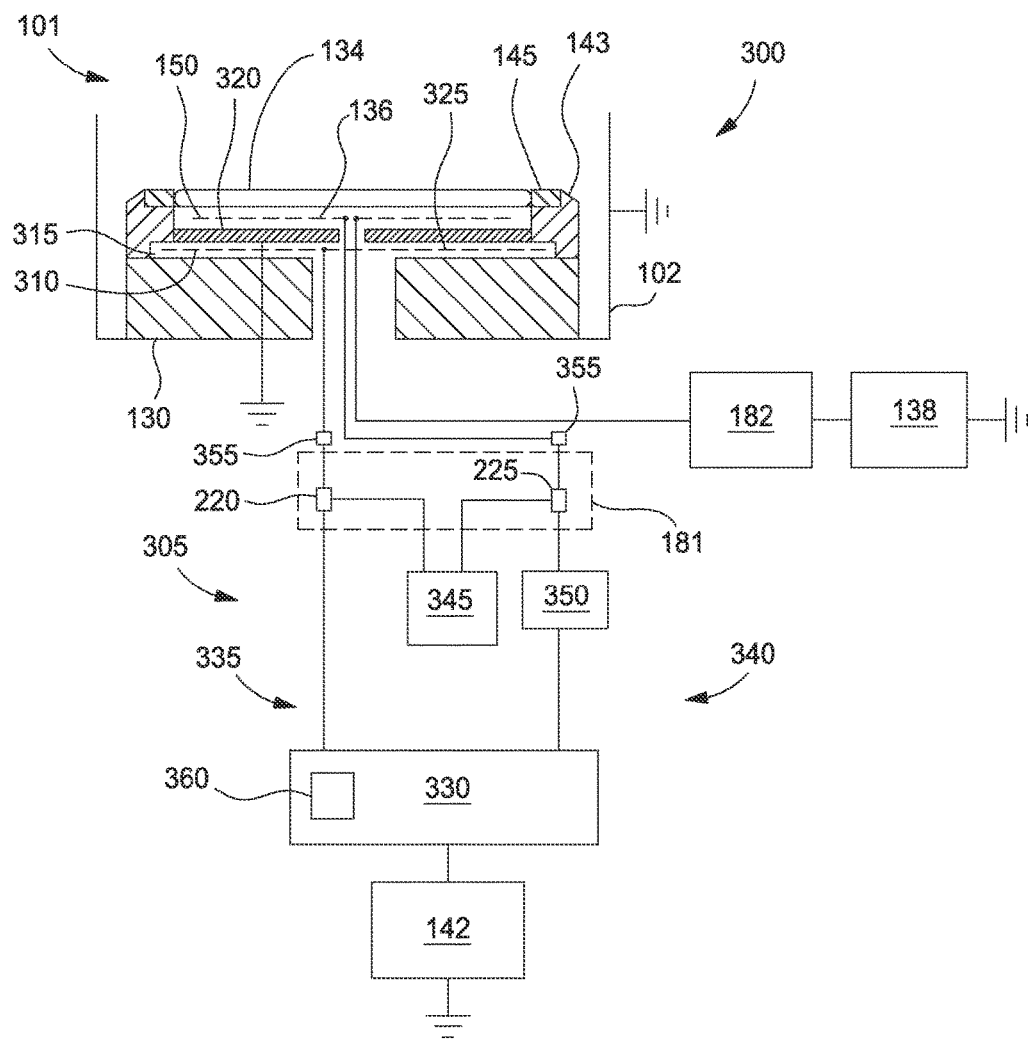
FIG. 3 is a partial schematic cross-sectional view of another embodiment of a processing chamber with another embodiment of a substrate support assembly and a power application system.

FIG. 3 is a partial schematic cross-sectional view of another embodiment of a processing chamber 300 having a substrate support assembly 101 and a power application system 305. Only a lower portion of the processing chamber 300 is shown as the substrate support assembly 101 and the power application system 305 may be utilized with other processing chambers. For example, the upper portion of the processing chamber 200 may be configured with hardware for plasma etching, chemical vapor deposition, ion implantation, stripping, physical vapor deposition, plasma annealing, and plasma treatment, among others.

The processing chamber 300 includes the substrate support assembly 101 having the chucking electrode 136 coupled to the first RF power source 142. However, in this embodiment, a second RF electrode 310 is also coupled to the first RF power source 142. The second RF electrode 310 may be disposed in a ceramic plate 315 positioned between the cooling base 130 and the dielectric body 150 of the electrostatic chuck 126. The second RF electrode 310 may be separated from the chucking electrode 136 by a metallic ground plate 320. The metallic ground plate 320 may be positioned between the ceramic plate 315 and the dielectric body 150. The metallic ground plate 320 is utilized to electromagnetically isolate the second RF electrode 310 from the chucking electrode 136. The second RF electrode 310 may be a conductive mesh 325. Alternatively, the second RF electrode 310 may be a solid plate made of a conductive material. The metallic ground plate 320 may be an aluminum plate that is coupled to ground potential.

The first RF power source 142 is operably coupled to both of the chucking electrode 136 and the second RF electrode 310. A single matching network 330 is disposed between the first RF power source 142 and each of the chucking electrode 136 and the second RF electrode 310. Thus, a first RF system 335 and a second RF system 340 are provided, and the chucking electrode 136 and the second RF electrode 310 of each system share the first RF power source 142 and the matching network 330. The sensor device 181 includes the first sensor 220 and the second sensor 225 as in other embodiments, but the sensor device 181 may be optional or utilized only for initial and/or periodic calibration. One or both of a controller 345 and a phase shifter 350 may also be included in each of the first RF system 335 and the second RF system 340. For example, the phase shifter 350 may be utilized to control phase angle based on feedback from the sensor device 181, which may negate a need for the controller 345 being utilized to control operation of the power application system 305.

In some embodiments, the matching network 330 may be utilized as a power splitter that varies power from the first RF power source 142 to each of the chucking electrode 136 and the second RF electrode 310. Utilizing one RF generator together with a power splitting circuit 360 and a phase control/delay circuit (e.g., phase shifter 350) to implement multiple electrode driving may reduce costs of ownership. In other embodiments, the circuit of matching network 330 serves two functions. A first function may be impedance matching while the second function may be power splitting between the chucking electrode 136 and the second RF electrode 310. The manner of power splitting may be controllable through a variable impedance circuit 355 coupled to either the chucking electrode 136 or the second RF electrode 310. The variable impedance circuit 355 may be utilized to vary the relative impedances the chucking electrode 136 and the second RF electrode 310. In some embodiments, varying the relative impedances the chucking electrode 136 and the second RF electrode 310 changes the power distribution between the chucking electrode 136 and the second RF electrode 310. Changing the power distribution between the second RF electrode 310 and the chucking electrode 136 may be utilized to tune the plasma.

In some embodiments, the phases of the RF signals from the first RF power source 142 after splitting and matching are sensed by the first sensor 220 and the second sensor 225. The signals may be transmitted to the controller 345. The controller 345 may be utilized to control the phase shifter 350 to control the phase difference between the chucking electrode 136 and the second RF electrode 310. The phase shifter 345 may be a phase delay circuit or a more advanced device such as high RF power vector modulator. The two RF hot electrodes, the chucking electrode 136 and the second RF electrode 310, are electrically separated from each other in this embodiment. Decoupling of the chucking electrode 136 or the second RF electrode 310 can produce easier phase and/or power control since the crosstalk between multiple RF generators is decreased. Decoupling may also provide more sensitive and/or effective edge tuning. The improved edge tuning may be due to the relative sizes of the second RF electrode 310 and the chucking electrode 136 as the larger electrode may have a lesser impact on the center area of the substrate 134. Additionally, the decoupling may also increase the phase angle operating regime. Further, if the whole system is fabricated according to the same standard, the first sensor 220 and the second sensor 225 may not be necessary for the chamber after initial calibration.

Figure 4:
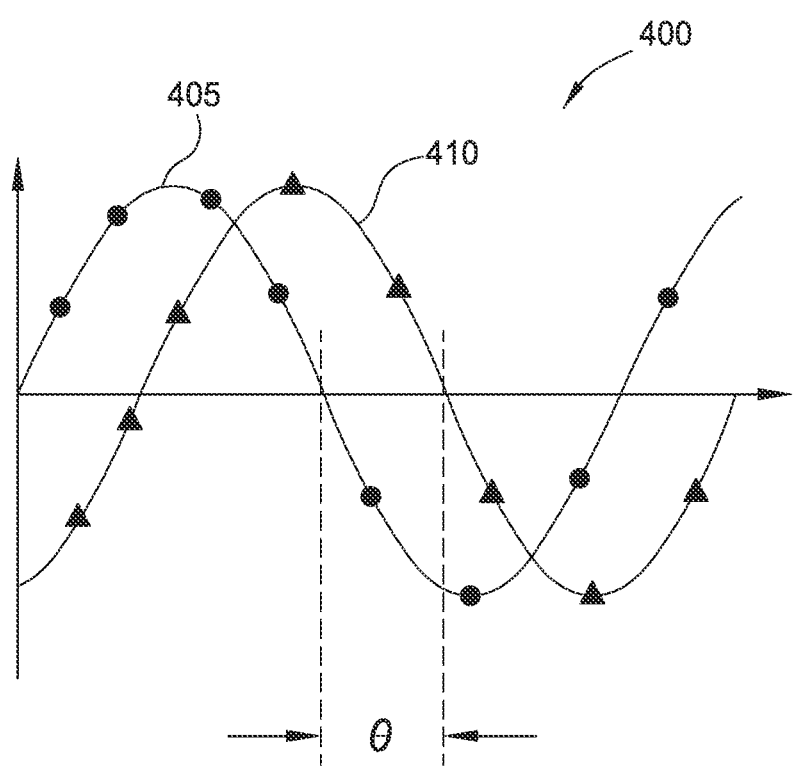
FIG. 4 is an exemplary phase diagram showing a first waveform and a second waveform according to one embodiment.

FIG. 4 is an exemplary phase diagram 400 showing a first waveform 405 and a second waveform 410. The first waveform 405 may be indicative of the RF signal from the first RF system 210 (FIG. 2) or 335 (FIG. 3), and the second waveform 410 may be indicative of the RF signal from the second RF system 215 (FIG. 2) or 340 (FIG. 3). The first waveform 405 and the second waveform 410 may be measured by the first sensor 220 and the second sensor 225 (FIG. 2 or 3) downstream of a matching network. While the first waveform 405 and the second waveform 410 are shown as having the same frequency and amplitude in this example, the first waveform 405 and the second waveform 410 may have a different frequency and/or amplitude.

The phase difference θ between the first waveform 405 and the second waveform 410 may be varied as desired based on the desired characteristics of a plasma. The phase angle may be varied between about 0 degrees to about 360 degrees. The first waveform 405 and the second waveform 410 may be constructive or destructive based on the desired characteristics of a plasma.

Control of the RF phase difference and/or phase angle provides a powerful knob for fine process tuning. For example, control of the RF phase difference and/or phase angle may be utilized to control one or more of average etch rate, etch rate uniformity, etch rate skew, critical dimension (CD) uniformity, CD skew, CD range, and plasma uniformity and/or plasma density.

While the foregoing is directed to implementations of the present disclosure, other and further implementations of the disclosure may be devised without departing from the basic scope thereof, and the scope thereof is determined by the claims that follow.

We claim:

1. A method for tuning a plasma in a chamber, the method comprising: providing a first radio frequency power and a direct current power to a first electrode embedded in a dielectric body of a substrate support assembly to form a plasma in the chamber, the first electrode having a diameter that is substantially equal to a diameter of a substrate and is positioned adjacent to a substrate support surface of the substrate support assembly; providing a second radio frequency power to a second electrode in the substrate support assembly to tune the plasma through the first electrode, the second electrode having a diameter greater than the diameter of the first electrode; monitoring a phase angle of the first and second radio frequency power using a sensor; and adjusting one or both of the first and second radio frequency power based on feedback from the sensor.

2. The method of claim 1, wherein the adjusting comprises phase shifting one or both of the first and second radio frequency power.

3. The method of claim 1, wherein the first and second radio frequency power are provided by a single power source.

4. The method of claim 3, wherein the first and second radio frequency power is split by a single matching network.

5. The method of claim 3, wherein the adjusting comprises phase shifting one or both of the first and second radio frequency power.

6. The method of claim 1, wherein the first radio frequency power is provided by a first power source and the second radio frequency power is provided by a second power source.

7. The method of claim 1, wherein the plasma is utilized for an etch process, a deposition process, or a stripping process.

8. The method of claim 1, wherein the second electrode includes a surface area that is greater than a surface area of the first electrode.

9. A method for tuning a plasma in a chamber, the method comprising: providing a first radio frequency power and a direct current power to a first electrode embedded in a dielectric body of a substrate support assembly to form a plasma in the chamber, the first electrode having a diameter that is substantially equal to a diameter of a substrate and is positioned adjacent to a substrate support surface of the substrate support assembly; providing a second radio frequency power to a second electrode in the substrate support assembly to tune the plasma through the first electrode, the second electrode having a diameter greater than the diameter of the first electrode and being positioned at a location further from the support surface; monitoring a phase angle of the first and second radio frequency power using a sensor; and changing the phase angle of one or both of the first and second radio frequency power based on feedback from the sensor.

10. The method of claim 9, wherein the first and second radio frequency power are provided by a single power source.

11. The method of claim 10, wherein the first and second radio frequency power is split by a single matching network.

12. The method of claim 9, wherein the first radio frequency power is provided by a first power source and the second radio frequency power is provided by a second power source.

13. The method of claim 9, wherein the plasma is utilized for an etch process, a deposition process, or a stripping process.

14. A method for tuning a plasma in a chamber, the method comprising: providing a first radio frequency power and a direct current power to a first electrode embedded in a dielectric body of a substrate support assembly to form a plasma in the chamber, the first electrode having a diameter that is substantially equal to a diameter of a substrate and is positioned adjacent to a substrate support surface of the substrate support assembly; providing a second radio frequency power to a second electrode in the substrate support assembly to tune the plasma through the first electrode, the second electrode having a diameter greater than the diameter of the first electrode and being positioned at a location further from the support surface; monitoring a phase angle of the first and second radio frequency power using a sensor; and shifting the phase angle of one or both of the first and second radio frequency power based on feedback from the sensor, wherein the second electrode includes a surface area that is greater than a surface area of the first electrode.

15. The method of claim 14, wherein the first and second radio frequency power are provided by a single power source.

16. The method of claim 15, wherein the first and second radio frequency power is split by a single matching network.

17. The method of claim 15, wherein the adjusting comprises phase shifting one or both of the first and second radio frequency power.

18. The method of claim 14, wherein the first radio frequency power is provided by a first power source and the second radio frequency power is provided by a second power source.

19. The method of claim 14, wherein the plasma is utilized for an etch process, a deposition process, or a stripping process.

* * * * *